US011670490B2

United States Patent
Hsu et al.

(10) Patent No.: US 11,670,490 B2
(45) Date of Patent: *Jun. 6, 2023

(54) INTEGRATED CIRCUIT FABRICATION SYSTEM WITH ADJUSTABLE GAS INJECTOR

(71) Applicant: Taiwan Semiconductor Manufacturing Co., Ltd., Hsinchu (TW)

(72) Inventors: Yung-Shun Hsu, Changhua County (TW); Ching-Yu Chang, Tainan (TW); Chiao-Kai Chang, Taichung (TW); Wai Hong Cheah, Taichung (TW); Chien-Fang Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,807

(22) Filed: Jan. 8, 2018

(65) Prior Publication Data

US 2019/0103295 A1    Apr. 4, 2019

Related U.S. Application Data

(60) Provisional application No. 62/565,325, filed on Sep. 29, 2017.

(51) Int. Cl.
*H01J 37/32* (2006.01)
*H01L 21/67* (2006.01)
(Continued)

(52) U.S. Cl.
CPC .......... *H01J 37/3244* (2013.01); *H01J 37/32* (2013.01); *H01J 37/32449* (2013.01);
(Continued)

(58) Field of Classification Search
CPC ... C23C 16/45563; C23C 14/52; C23C 14/54; C23C 14/547; C23C 16/4409;
(Continued)

(56) References Cited

U.S. PATENT DOCUMENTS 2,890,351 A * 6/1959 Tongret .................. H01J 40/14
250/239
3,519,491 A * 7/1970 Grohall .................... G01K 1/14
136/217

(Continued)

FOREIGN PATENT DOCUMENTS

CN         1639831 A      7/2005
CN       101529997 A      9/2009
(Continued)

OTHER PUBLICATIONS

U.S. Appl. No. 62/181,689 in the names of Khokan C. Paul et al., filed Jun. 18, 2015 and entitled "In-Situ Metrology Method for Thickness Measurement During PECVD Processes." pp. 1-41. (Year: 2015).*

(Continued)

*Primary Examiner* — Jeffrie R Lund
(74) *Attorney, Agent, or Firm* — Haynes and Boone, LLP (57) ABSTRACT

The present disclosure provides a semiconductor fabrication apparatus. The semiconductor apparatus includes a processing chamber; a substrate stage provided in the processing chamber and being configured to secure and rotate a semiconductor wafer; a gas injector configured to inject a chemical to the processing chamber; a window attached to the gas injector; and an adjustable fastening device coupled with the gas injector and the window.

20 Claims, 6 Drawing Sheets

(51) Int. Cl.
*H01L 21/3065* (2006.01)
*H01L 21/3213* (2006.01)

(52) U.S. Cl.
CPC .... *H01J 37/32733* (2013.01); *H01L 21/3065* (2013.01); *H01L 21/32136* (2013.01); *H01L 21/67069* (2013.01); *H01L 21/67126* (2013.01); *H01L 21/67167* (2013.01); *H01L 21/67201* (2013.01); *H01J 2237/20214* (2013.01); *H01J 2237/334* (2013.01)

(58) Field of Classification Search
CPC ............... C23C 16/455; C23C 16/488; H01J 2237/20214; H01J 2237/334; H01J 37/32449; H01J 37/32733; H01J 2237/032; H01J 37/32119; H01J 37/32238; H01J 37/32917; H01J 37/32935; H01J 37/32944; H01J 37/32954; H01J 37/32963; H01J 37/32972; H01J 37/3299; H01J 37/3244; H01L 21/67069; H01L 21/67126; H01L 21/3065; H01L 21/31116; H01L 21/32135; H01L 21/67248; H01L 21/32136; H01L 21/67167; H01L 21/67201; H01L 21/6708; H01L 21/683; H01L 21/68721; B01J 3/004; F16B 31/025; F16B 9/052; F16B 9/054; F16B 9/056; F16B 9/058; G01J 5/041; G01J 5/048; G01J 5/08; G01J 5/0821; G01J 5/084; G01J 5/0862; G01J 5/0893; G01K 1/14; G01K 13/00; G02B 27/0006; G02B 27/022; G02B 6/262; G02B 6/3897; G02B 7/00; G02B 7/003; G02B 7/006; G02B 7/007; G02B 7/1825

See application file for complete search history.

(56) References Cited

U.S. PATENT DOCUMENTS

| | | | | |
|---|---|---|---|---|
| 3,707,452 A * | 12/1972 | Lester et al. | ......... | B65H 18/021 |
| | | | | 204/192.22 |
| 3,877,131 A | 4/1975 | Grenville | | |
| 3,886,474 A * | 5/1975 | Hensolt | ............ | H01S 3/034 |
| | | | | 372/107 |
| 3,987,699 A * | 10/1976 | Popenoe | ............ | F16B 31/025 |
| | | | | 411/13 |
| 4,478,701 A * | 10/1984 | Welch | ............ | C23C 14/3407 |
| | | | | 204/298.12 |
| 4,638,486 A * | 1/1987 | Dost | ............ | H01S 3/086 |
| | | | | 359/873 |
| 4,686,685 A * | 8/1987 | Hoag | ............ | H01S 3/036 |
| | | | | 372/107 |
| 4,769,824 A * | 9/1988 | Seki | ............ | H01S 3/086 |
| | | | | 372/65 |
| 4,809,862 A * | 3/1989 | Canty | ............ | G02B 7/007 |
| | | | | 220/663 |
| 4,953,036 A * | 8/1990 | Yoshimura | ............ | G06K 15/1204 |
| | | | | 358/400 |
| 5,038,711 A * | 8/1991 | Dan | ............ | C30B 25/02 |
| | | | | 118/668 |
| 5,129,994 A * | 7/1992 | Ebbing | ............ | H01L 21/67253 |
| | | | | 156/916 |
| 5,141,125 A * | 8/1992 | Canty | ............ | B01J 3/004 |
| | | | | 220/377 |
| 5,354,413 A * | 10/1994 | Smesny | ............ | H01J 37/32009 |
| | | | | 156/345.47 |
| 5,556,204 A * | 9/1996 | Tamura | ............ | C23C 14/541 |
| | | | | 250/234 |
| 5,635,409 A * | 6/1997 | Moslehi | ............ | B24B 37/013 |
| | | | | 438/7 |
| 5,660,472 A * | 8/1997 | Peuse | ............ | G01J 5/0003 |
| | | | | 374/128 |
| 5,759,424 A * | 6/1998 | Imatake | ............ | H01J 37/3299 |
| | | | | 216/60 |
| 5,796,066 A * | 8/1998 | Guyot | ............ | B23K 37/047 |
| | | | | 219/121.48 |
| 5,855,677 A * | 1/1999 | Carlson | ............ | C23C 16/4405 |
| | | | | 118/666 |
| 5,869,802 A * | 2/1999 | Spencer | ............ | B23K 10/027 |
| | | | | 219/121.48 |
| 5,885,402 A * | 3/1999 | Esquibel | ............ | H01J 37/32935 |
| | | | | 156/345.24 |
| 5,985,092 A * | 11/1999 | Chiu | ............ | H01J 37/321 |
| | | | | 118/712 |
| 6,005,249 A * | 12/1999 | Hayes, Jr. | ............ | G01J 1/04 |
| | | | | 250/372 |
| 6,042,650 A * | 3/2000 | Uesugi | ............ | C23C 16/52 |
| | | | | 118/712 |
| 6,079,874 A * | 6/2000 | Hegedus | ............ | C23C 16/481 |
| | | | | 118/725 |
| 6,080,241 A * | 6/2000 | Li | ............ | C23C 16/455 |
| | | | | 118/715 |
| 6,090,210 A * | 7/2000 | Ballance | ............ | C23C 16/45565 |
| | | | | 118/50.1 |
| 6,146,242 A * | 11/2000 | Treur | ............ | B24B 37/013 |
| | | | | 451/6 |
| 6,157,106 A * | 12/2000 | Tietz | ............ | F16C 32/047 |
| | | | | 118/730 |
| 6,176,933 B1 * | 1/2001 | Yang | ............ | H01J 37/32458 |
| | | | | 118/722 |
| 6,226,453 B1 * | 5/2001 | Yam | ............ | G01J 5/0003 |
| | | | | 392/418 |
| 6,246,175 B1 * | 6/2001 | Kou | ............ | H01J 37/32192 |
| | | | | 118/723 IR |
| 6,263,542 B1 * | 7/2001 | Larson | ............ | E05D 3/022 |
| | | | | 16/289 |
| 6,267,545 B1 * | 7/2001 | Mooring | ............ | F16K 3/18 |
| | | | | 414/217 |
| 6,306,246 B1 * | 10/2001 | Melvin | ............ | G02B 27/0006 |
| | | | | 156/345.25 |
| 6,349,270 B1 * | 2/2002 | Gurary | ............ | G01J 5/0022 |
| | | | | 374/126 |
| 6,366,346 B1 * | 4/2002 | Nowak | ............ | C23C 16/4401 |
| | | | | 216/60 |
| 6,390,019 B1 * | 5/2002 | Grimbergen | ............ | H01J 37/32458 |
| | | | | 118/723 R |
| 6,493,375 B1 * | 12/2002 | Kodeda | ............ | H01S 3/086 |
| | | | | 372/55 |
| 6,503,364 B1 * | 1/2003 | Masuda | ............ | H01J 37/32009 |
| | | | | 118/712 |
| 6,562,186 B1 * | 5/2003 | Saito | ............ | H01L 21/31116 |
| | | | | 118/712 |
| 6,758,941 B1 * | 7/2004 | Ookawa | ............ | H01J 37/32082 |
| | | | | 118/723 E |
| 6,804,284 B1 * | 10/2004 | Kodeda | ............ | G02B 7/00 |
| | | | | 372/63 |
| 6,936,135 B2 * | 8/2005 | Antolik | ............ | H01J 37/32642 |
| | | | | 118/500 |
| 7,314,526 B1 * | 1/2008 | Preti | ............ | C30B 25/14 |
| | | | | 118/715 |
| 7,318,879 B2 * | 1/2008 | Kwon | ............ | H01J 37/32623 |
| | | | | 118/723 R |
| 7,524,532 B2 * | 4/2009 | Jurgensen | ............ | C23C 16/4412 |
| | | | | 118/500 |
| 8,083,891 B2 * | 12/2011 | Sato | ............ | H01L 21/67069 |
| | | | | 118/715 |
| 8,547,085 B2 * | 10/2013 | Booth | ............ | C23C 16/45574 |
| | | | | 118/723 AN |
| 9,154,712 B2 * | 10/2015 | Holliday | ............ | G01J 5/522 |
| | | | | 374/1 |
| 10,840,066 B2 * | 11/2020 | Hsu | ............ | H01J 37/32715 |
| 11,043,388 B2 * | 6/2021 | Hsu | ............ | H01L 21/67126 |
| 2001/0006530 A1 * | 7/2001 | Adams | ............ | G01J 5/0003 |
| | | | | 374/131 |
| 2001/0010257 A1 * | 8/2001 | Ni | ............ | H01J 37/3244 |
| | | | | 156/345.33 |

(56) References Cited

U.S. PATENT DOCUMENTS

| | | | | |
|---|---|---|---|---|
| 2001/0015175 | A1* | 8/2001 | Masuda | G01N 21/68 118/723 R |
| 2001/0041218 | A1* | 11/2001 | Cook | C23C 16/44 427/248.1 |
| 2002/0014203 | A1* | 2/2002 | Kim | G02B 7/007 118/713 |
| 2002/0100555 | A1* | 8/2002 | Hao | H01J 37/32568 156/345.33 |
| 2003/0038112 | A1* | 2/2003 | Liu | H01J 37/3299 216/60 |
| 2003/0070620 | A1* | 4/2003 | Cooperberg | C23C 16/45574 118/723 AN |
| 2003/0173029 | A1* | 9/2003 | Saito | H01L 21/31116 156/345.24 |
| 2003/0196458 | A1* | 10/2003 | Bennett | C03B 37/04 65/377 |
| 2004/0004989 | A1* | 1/2004 | Shigeoka | G01J 5/0003 374/121 |
| 2004/0020439 | A1* | 2/2004 | Chen | C23C 16/50 118/733 |
| 2004/0060516 | A1* | 4/2004 | Nishimoto | H01J 37/32458 118/723 E |
| 2004/0082251 | A1* | 4/2004 | Bach | C23C 16/52 445/60 |
| 2004/0129226 | A1* | 7/2004 | Strang | H01J 37/32642 118/728 |
| 2004/0134426 | A1* | 7/2004 | Tomoyasu | H01J 37/32458 118/713 |
| 2004/0142558 | A1* | 7/2004 | Granneman | C23C 16/4411 438/680 |
| 2004/0173155 | A1* | 9/2004 | Nishimoto | H01J 37/32458 118/715 |
| 2004/0184028 | A1* | 9/2004 | Fink | H01J 37/32862 356/72 |
| 2004/0237888 | A1* | 12/2004 | Codella | H01J 37/32935 118/712 |
| 2004/0262260 | A1* | 12/2004 | Yang | H01J 37/32935 216/60 |
| 2005/0011446 | A1* | 1/2005 | Fink | H01J 37/32091 438/478 |
| 2005/0053113 | A1* | 3/2005 | Clary | G02B 9/34 372/108 |
| 2005/0103972 | A1* | 5/2005 | Milton | G02B 7/003 248/676 |
| 2005/0109728 | A1* | 5/2005 | Oh | G02B 6/3847 216/20 |
| 2005/0140975 | A1* | 6/2005 | Sakai | H01J 37/32935 356/369 |
| 2005/0173375 | A1* | 8/2005 | Mitrovic | H01J 37/32935 216/60 |
| 2005/0189069 | A1* | 9/2005 | Ludviksson | H01J 37/32963 156/345.24 |
| 2005/0191044 | A1* | 9/2005 | Aderhold | F27B 17/0025 392/418 |
| 2006/0021568 | A1* | 2/2006 | Matsumoto | C23C 16/455 118/62 |
| 2006/0060138 | A1* | 3/2006 | Keller | H01J 37/3244 118/715 |
| 2006/0120011 | A1* | 6/2006 | Handa | H01L 21/67109 361/234 |
| 2006/0130763 | A1* | 6/2006 | Emerson | C23C 16/46 118/725 |
| 2006/0144520 | A1* | 7/2006 | Fink | B08B 7/0035 156/345.48 |
| 2006/0171442 | A1* | 8/2006 | Volf | G01J 5/522 374/1 |
| 2006/0193037 | A1* | 8/2006 | Strait | H01J 37/16 359/391 |
| 2007/0039548 | A1* | 2/2007 | Johnson | G01B 11/0683 118/665 |
| 2007/0131354 | A1* | 6/2007 | Yokogawa | H01J 37/32935 156/345.34 |
| 2007/0166599 | A1* | 7/2007 | Burtner | H01J 27/022 250/423 R |
| 2007/0169704 | A1* | 7/2007 | Hao | C23C 14/541 250/234 |
| 2007/0187363 | A1* | 8/2007 | Oka | H01J 37/3244 216/59 |
| 2007/0283704 | A1* | 12/2007 | Tanaka | F04B 37/08 62/55.5 |
| 2007/0286688 | A1* | 12/2007 | Bradley | E02D 29/025 405/276 |
| 2008/0006204 | A1* | 1/2008 | Rusinko | C23C 16/4581 118/715 |
| 2008/0083883 | A1* | 4/2008 | Bogart | C23C 16/513 250/423 P |
| 2008/0169282 | A1* | 7/2008 | Sorabji | H01L 21/67109 219/444.1 |
| 2008/0233016 | A1* | 9/2008 | Harvey | H01J 37/3244 422/119 |
| 2009/0016048 | A1* | 1/2009 | McBrien | F21L 19/00 362/180 |
| 2009/0042321 | A1* | 2/2009 | Sasaki | H01J 37/32449 438/10 |
| 2009/0047801 | A1* | 2/2009 | Low | H01J 37/241 439/50 |
| 2009/0120584 | A1* | 5/2009 | Lubomirsky | H01J 37/3299 216/60 |
| 2009/0159424 | A1* | 6/2009 | Liu | H01J 37/3244 204/164 |
| 2009/0199766 | A1* | 8/2009 | Tappan | B01J 3/004 220/377 |
| 2010/0007337 | A1* | 1/2010 | Booth | G01R 19/0061 324/149 |
| 2010/0073679 | A1* | 3/2010 | Larking | G01N 21/85 356/437 |
| 2010/0200546 | A1* | 8/2010 | Zaykova-Feldman | G03F 1/72 216/65 |
| 2010/0202042 | A1* | 8/2010 | Marchman | G03F 1/72 359/372 |
| 2010/0304571 | A1* | 12/2010 | Larson | H01L 21/67069 438/710 |
| 2011/0054661 | A1* | 3/2011 | Rasnick | H01J 37/32623 700/110 |
| 2011/0114261 | A1* | 5/2011 | Matsumoto | H01J 37/32192 156/345.33 |
| 2011/0126394 | A1* | 6/2011 | Heimmer | B25B 27/023 29/426.2 |
| 2011/0141473 | A1* | 6/2011 | Black | C23C 14/52 356/429 |
| 2011/0198417 | A1* | 8/2011 | Detmar | H01J 37/321 239/569 |
| 2011/0290419 | A1* | 12/2011 | Horiguchi | H01J 37/3244 156/345.29 |
| 2011/0291568 | A1* | 12/2011 | Iizuka | H01J 37/321 315/111.51 |
| 2012/0000301 | A1* | 1/2012 | Little | C23C 14/54 73/865.8 |
| 2012/0111269 | A1* | 5/2012 | Du | C23C 16/50 118/713 |
| 2012/0238102 | A1* | 9/2012 | Zhang | H01J 37/32422 438/718 |
| 2012/0238103 | A1* | 9/2012 | Zhang | H01J 37/32422 438/720 |
| 2012/0273130 | A1* | 11/2012 | Drewery | H01J 37/32651 156/345.3 |
| 2012/0305190 | A1* | 12/2012 | Kang | H01J 37/321 156/345.34 |
| 2013/0008607 | A1* | 1/2013 | Matsumoto | H01J 37/32238 156/345.41 |
| 2013/0098554 | A1* | 4/2013 | Chhatre | C03B 37/04 65/377 |
| 2013/0127124 | A1* | 5/2013 | Nam | H01J 37/32577 279/128 |
| 2013/0133834 | A1* | 5/2013 | Dhindsa | H01L 21/32136 438/710 |
| 2013/0188040 | A1* | 7/2013 | Kamen | H01J 37/3244 156/345.33 |

(56) References Cited

U.S. PATENT DOCUMENTS

| | | | |
|---|---|---|---|
| 2013/0284700 A1* | 10/2013 | Nangoy | B05B 1/185 216/58 |
| 2013/0310990 A1* | 11/2013 | Peret | H01J 37/3244 216/59 |
| 2013/0323860 A1* | 12/2013 | Antolik | H01J 37/32449 438/10 |
| 2013/0340677 A1* | 12/2013 | Tas | C23C 16/52 118/712 |
| 2014/0024142 A1* | 1/2014 | Shriner | C30B 25/02 118/668 |
| 2014/0036274 A1* | 2/2014 | Marquardt | G01B 11/14 356/614 |
| 2014/0053779 A1* | 2/2014 | Martinson | C23C 16/52 118/723 R |
| 2014/0118751 A1* | 5/2014 | Rajagopalan | C23C 16/46 356/630 |
| 2014/0218817 A1* | 8/2014 | Gunell | C23C 16/455 118/715 |
| 2014/0263179 A1* | 9/2014 | Waldfried | H01P 1/207 216/61 |
| 2014/0377890 A1* | 12/2014 | Voronov | G01N 21/6489 438/16 |
| 2015/0020969 A1* | 1/2015 | Sriraman | H01J 37/32651 156/345.24 |
| 2015/0026941 A1* | 1/2015 | Heimmer | C23C 16/45565 118/50.1 |
| 2015/0037981 A1* | 2/2015 | Sriraman | H01J 37/32449 438/714 |
| 2015/0064923 A1* | 3/2015 | Matsumoto | H01L 21/67248 438/716 |
| 2015/0107669 A1* | 4/2015 | Gotoh | C09K 3/1018 136/259 |
| 2015/0140786 A1* | 5/2015 | Kwak | H01J 37/32091 438/478 |
| 2015/0225854 A1* | 8/2015 | Madsen | G01J 5/0003 374/128 |
| 2015/0233016 A1* | 8/2015 | Brillhart | F27B 17/0025 392/418 |
| 2015/0371882 A1* | 12/2015 | Tsai | H01L 21/67248 438/716 |
| 2015/0380281 A1* | 12/2015 | Sriraman | H01L 21/67109 219/444.1 |
| 2016/0005666 A1* | 1/2016 | Woodard | G01J 3/0218 438/9 |
| 2016/0041359 A1* | 2/2016 | Gaskin | G01J 3/0202 33/286 |
| 2016/0111265 A1* | 4/2016 | Siegert | C23C 16/481 118/725 |
| 2016/0141148 A1* | 5/2016 | Sun | H01J 37/32935 156/345.24 |
| 2016/0163517 A1* | 6/2016 | Tanaka | F16C 32/047 118/730 |
| 2016/0181996 A1* | 6/2016 | Baecklund | G01J 5/0003 374/131 |
| 2016/0222508 A1* | 8/2016 | Schoepp | G01J 5/0003 392/418 |
| 2016/0289827 A1* | 10/2016 | Augustyniak | C23C 16/52 |
| 2016/0293431 A1* | 10/2016 | Sriraman | G01J 5/0003 374/121 |
| 2016/0307812 A1* | 10/2016 | Kenane | H01L 21/67253 |
| 2016/0343625 A1* | 11/2016 | Wu | H01J 37/3244 |
| 2016/0370173 A1* | 12/2016 | Paul | B23K 37/047 219/121.48 |
| 2017/0052319 A1* | 2/2017 | Schultheis | G02B 6/0008 |
| 2017/0148654 A1* | 5/2017 | Paul | H01P 1/207 216/61 |
| 2017/0365444 A1* | 12/2017 | Kim | G02B 6/0008 |
| 2019/0057889 A1* | 2/2019 | Mao | H01J 37/32651 156/345.3 |
| 2019/0103295 A1* | 4/2019 | Hsu | H01L 21/3065 |
| 2019/0385816 A1* | 12/2019 | Hsu | H01L 22/26 |
| 2020/0135510 A1* | 4/2020 | Hsu | H01L 21/67126 |
| 2021/0035777 A1* | 2/2021 | Hsu | H01J 37/3211 |
| 2021/0043423 A1* | 2/2021 | Hsu | H01J 37/32963 |

FOREIGN PATENT DOCUMENTS

| | | | | |
|---|---|---|---|---|
| CN | 106373850 A | | 2/2017 | |
| CN | 106415123 A | | 2/2017 | |
| CN | 106601580 A | * | 4/2017 | G01N 21/39 |
| CN | 106601580 A | | 4/2017 | |
| CN | 106653658 A | | 5/2017 | |
| CN | 206428325 U | | 8/2017 | |
| GB | 2528976 A | * | 2/2016 | G01N 21/39 |
| KR | 20140090219 A | | 7/2014 | |
| KR | 20140094848 A | * | 7/2014 | B25B 5/10 |
| KR | 20140094848 A | | 7/2014 | |
| KR | 20150094537 A | | 8/2015 | |
| TW | 200739713 | | 10/2007 | |
| WO | WO-2013176144 A1 | * | 11/2013 | H01J 37/32192 |
| WO | WO-2015169685 A1 | * | 11/2015 | G02B 6/0008 |

OTHER PUBLICATIONS

U.S. Appl. No. 61/382,176 in the name of Khokan C. Paul et al., filed Sep. 23, 2015 and entitled "In-Situ Metrology Method for Thickness Measurement During PECVD Processes." pp. 1-38. (Year: 2015).*

* cited by examiner

INTEGRATED CIRCUIT FABRICATION SYSTEM WITH ADJUSTABLE GAS INJECTOR

PRIORITY DATA

This application claims priority to U.S. Provisional Patent Application Ser. No. 62/565,325 filed Sep. 29, 2017, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing equipment are needed. In one example, a plasma processing system is utilized to perform plasma etching process. During a plasma etching process, the plasma generates volatile etch products from the chemical reactions between the elements of the material etched and the reactive species generated by the plasma, which modifies the surface of the target. The plasma processing system includes a processing chamber maintained at vacuum state and a chemical supply module to provide chemical to chemical for etching. However, the chemical supply module in the existing IC fabrication system experience leaking issue, which further degrades the etching performance. Accordingly, it would be desirable to provide a IC fabrication system and a method utilizing the same absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
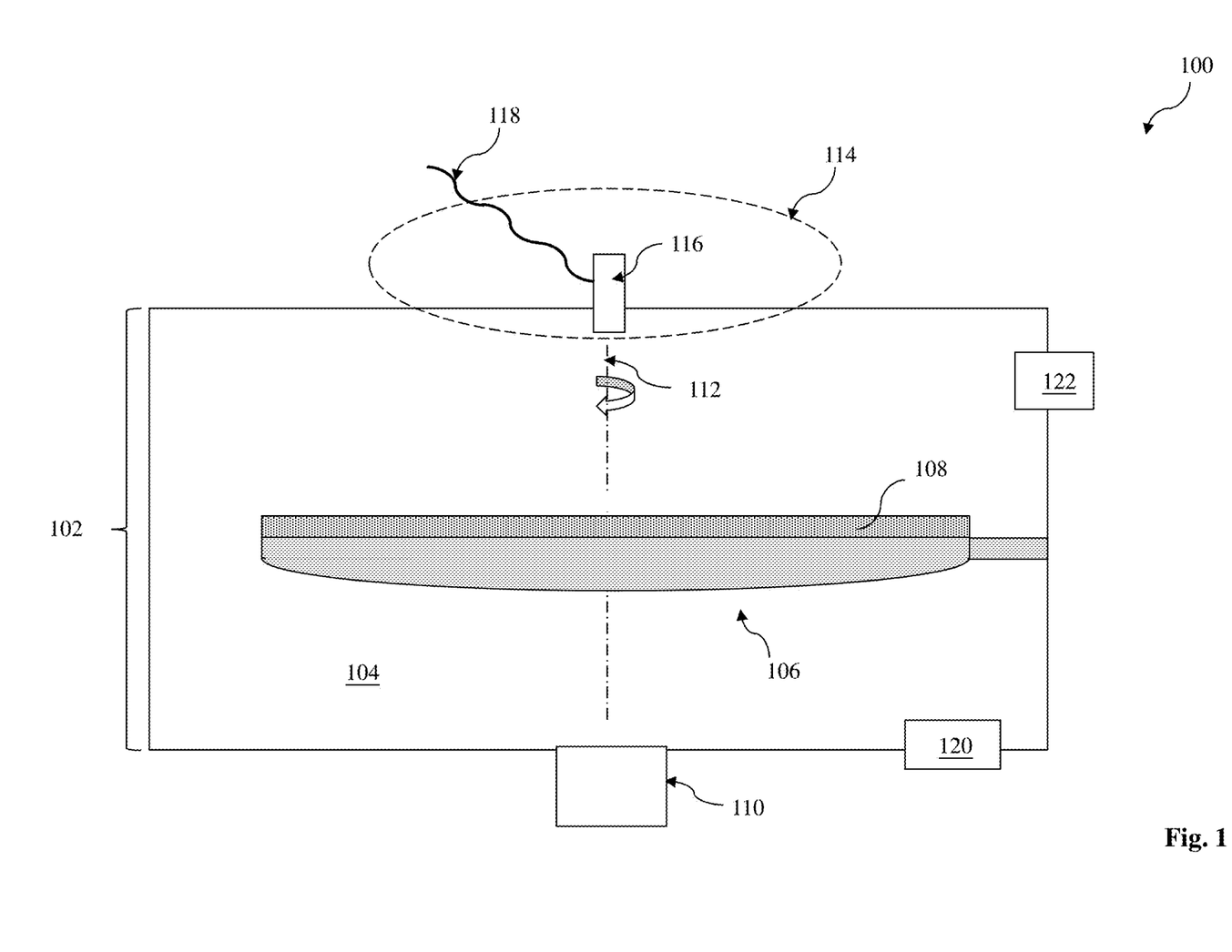
FIG. 1 illustrates a schematic view of a plasma module for integrated circuit fabrication, constructed in accordance with some embodiments.

FIG. 1 illustrates a schematic view of a plasma module 100 for integrated circuit (IC) fabrication, constructed in accordance with some embodiments. With reference to FIG. 1 and other figures, the plasma module 100 and the method utilizing the same are collectively described below.

The plasma module 100 includes a processing chamber 102 with enclosed space 104 for semiconductor processing. In the present embodiment, the semiconductor processing is plasma etching, such as plasma etching to metal or polysilicon. The processing chamber 102 includes various walls integrated together such that the enclosed space 104 is isolated from the environment and can be maintained at a suitable state, such as vacuum or a low pressure.

The plasma module 100 also includes a substrate stage 106 provided in the processing chamber 102 to secure a semiconductor substrate 108, such as a silicon wafer. The substrate stage 106 is designed with a rotation mechanism 110, such as a motor. The substrate stage 106 is operable to rotate by the rotation mechanism 110 around a rotation axis 112 so that the semiconductor substrate 108 secured on the substrate stage 106 rotates as well during an IC fabrication.

The plasma module 100 includes one or more chemical delivery unit 114 integrated to the processing chamber 102 and is designed to provide a chemical to the processing chamber 102. In various examples, the chemical is an etching gas or a carry gas, such as nitrogen, argon or other suitable gas. The chemical delivery unit 114 includes an adjustable gas injector 116 attached to the processing chamber and designed to inject the chemical into the processing chamber 102. The chemical delivery unit 114 is further connected to a chemical supply source 118 to provide the chemical to the gas injector 116. The chemical delivery unit 114 is further described in details later.

The plasma module 100 may further includes components, modules and parts integrated together to be functional for IC fabrication, such as plasma etching. For example, the plasma module 100 includes a pumping module 120 integrated with the processing chamber 102 and being operable to maintain the space 104 inside the processing chamber 102 at vacuum state or a low pressure. In various examples, the pumping module 120 may include one or more pumps, and may utilize multiple pumping technologies, such as positive displacement pump, momentum transfer pump, regenerative pump or entrapment pump. Various pumps may be configured in series according to respective working ranges.

The plasma module 100 includes a plasma generation module 122 to generate plasma inside the space 104 in the processing chamber 102. The plasma generation module 122 introduces energy power into the processing chamber to ignite plasma with any suitable technology, such as capacitive-coupled plasma or inductive-coupled plasma.

Figure 2:
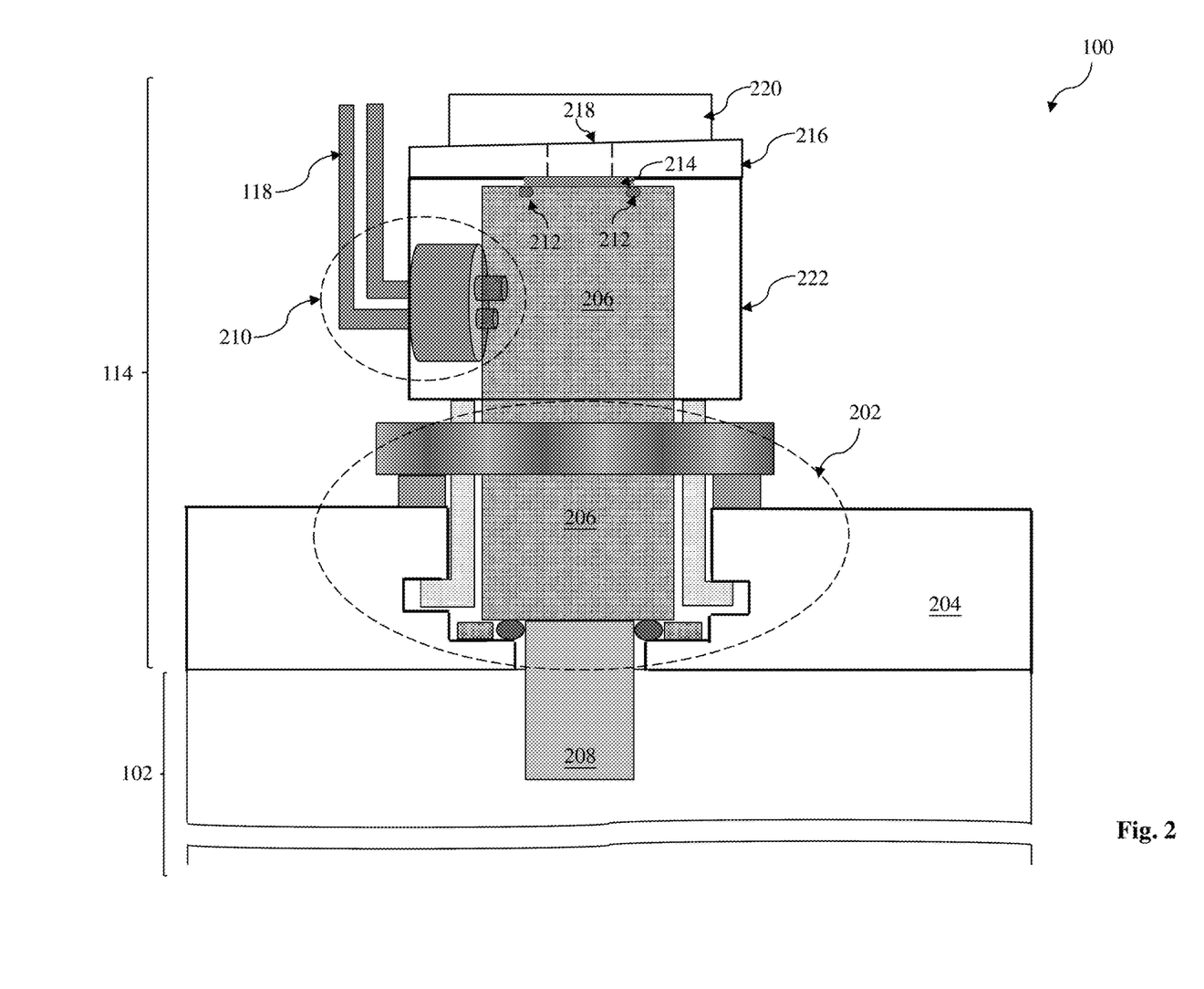
FIG. 2 illustrates a schematic view of the plasma module having a gas injector with an adjustable fastening mechanism, constructed in accordance with some embodiments.

FIG. 2 illustrates a schematic view of the plasma module 100, in portion, constructed in accordance with some embodiments. The chemical delivery unit 114 is illustrated with more details. Particularly, the chemical delivery unit 114 includes an adjustable fastening mechanism. The chemical delivery unit 114 includes a fixture 202 to attach and secure the gas injector 116 onto the top cover 204 of the processing chamber 102. The gas injector 116 includes a cylindrical body 206 to provide a passage for the chemical to a gas injector head 208 configured on one end of the cylindrical body 206. The chemical is delivered to the gas injector 116 from the chemical supply source 118 through an inlet 210 that connects the chemical supply source 118 to the gas injector 116.

The gas injector 116 further includes an O-ring 212 disposed on the gas injector 116, such as on a circular groove of the gas injector 116; a transparent window 214 configured on the O-ring 212; and a gas injector cover 216 configured on the transparent window 214, which is aligned to the center 218 of the gas injector cover 216. When the above three components are held together, they provide a sealing effect such that leakage is eliminated. Furthermore, the transparent window 214 provides an additional function, such as monitoring the IC fabrication inside the processing chamber, or particularly monitoring the plasma signal in the plasma module 100. The transparent window 214 is made of a material transparent to detection signal or visual light. In the present embodiment, the transparent window 214 is made of liquid silicone rubber (LSR). The transparent window 214 is designed with a suitable shape, such as a round plate.

The gas injector cover 216 is designed to cover the cylindrical body 206 and may be made of a suitable material with enough mechanical strength and meeting other requirements. For examples, the gas injector cover 216 is made of polytetrafluoroethylene (PTFE). In the present embodiment, the top surface of the gas injector cover 216 is an inclined plane by design.

The chemical delivery unit 114 further includes an adjustable fastening device (AFD) 220 to hold the gas injector cover 216, the transparent window 214 and the O-ring 212 together with adjustable height for enhanced sealing effect. In some embodiments, the gas injector 116 includes an extension portion 222. The adjustable fastening device 220 hold the gas injector cover 216, the transparent window 214, the O-ring 212, and the gas injector together through the extension portion 222.

Figure 3A:
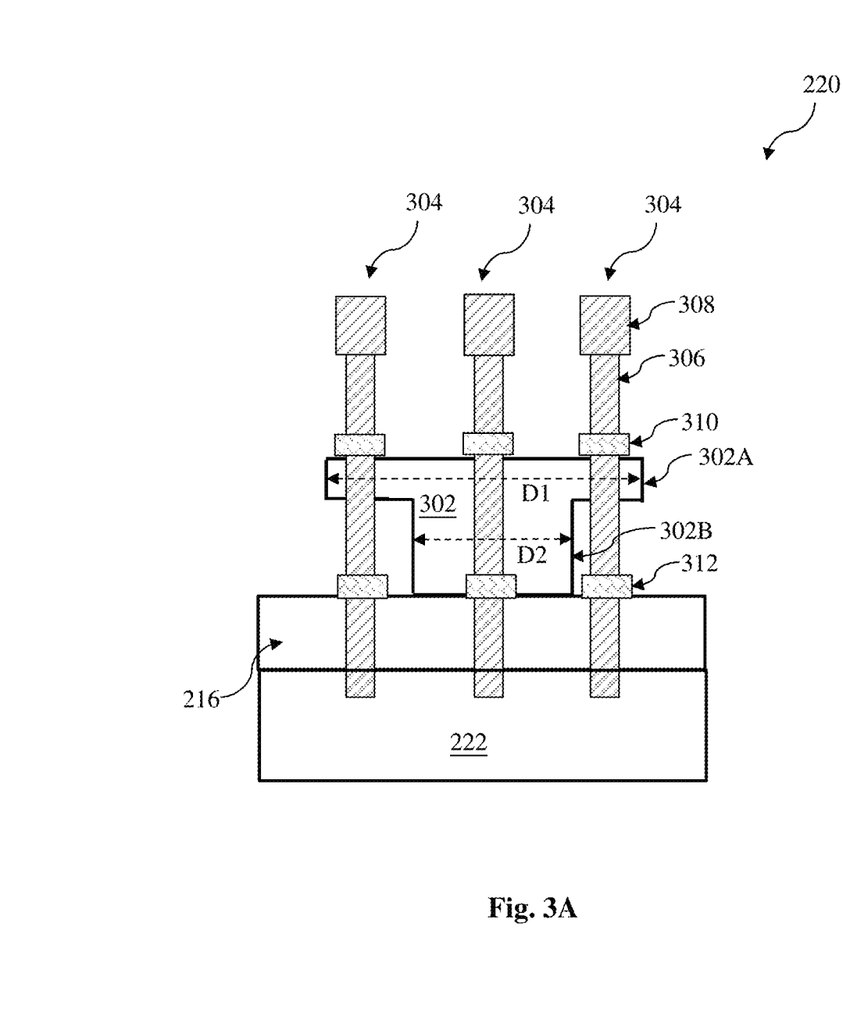
FIG. 3A illustrates a schematic view of the adjustable fastening device, constructed in accordance with some embodiments.

FIG. 3A illustrates a schematic view of the adjustable fastening device 220, constructed in accordance with some embodiments. The adjustable fastening device 220 is further described in details. The AFD 220 includes a base plate 302 disposed on the gas injector cover 216. The base plate 302 is designed to have suitable geometry to enable the fastening effect between the gas injector cover 216 and the base plate 302 and to have a suitable material, such as PTFE, for the mechanical strength and other functions. With AFD 220, the gas injector 116 is adjustable for height, distance, fastening force and sealing effect.

In the present embodiment, the base plate 302 includes a top portion 302A and a bottom portion 302B having different sizes. As illustrated in FIG. 3A, the top portion 302A spans a dimension D1 and the bottom portion 302B spans a dimension D2 less than D1.

The AFD 220 includes multiple sets of bolt and nuts, each set being referred to as a fastener 304. In the present embodiment, the number of the fasteners is three. Each fastener 304 includes a bolt 306 with a bolt head 308 designed to a structure, such as groove or socket, to provide a means for driving or holding the bolt. Each fastener 304 further includes a first nut 310 and a second nut 312 sleeved on the corresponding bolt 306. Each bolt has a thread pattern on the inside surface and each nut has an opening with thread pattern on inside surface. The nuts and bolt are configured for fastening by thread friction. The first nut 310 is configured above the base plate (particularly, between the bolt head 308 and the base plate 302); and the second nut 312 is configured between the base plate 302 and the gas injector cover 216. The first nut 310 is operable to control the height of the gas injector cover 216 or control the distance between the base plate 302 and the gas injector cover 216; and the second nut 312 is operable to fasten the gas injector cover 216 to the gas injector 220, such as the extended portion 222 of the gas injector 116 configured between the base plate 302 and the gas injector cover 216.

Figure 3B:
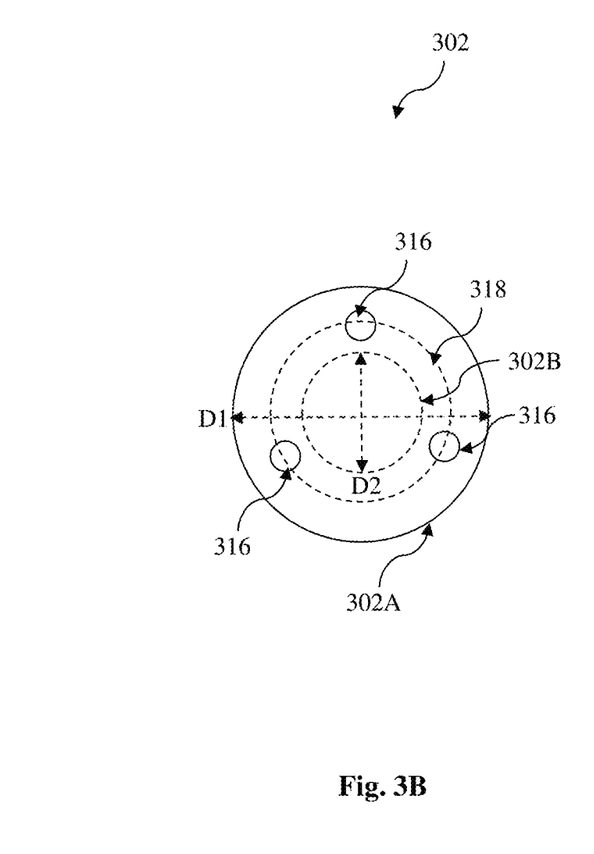
FIG. 3B illustrates a top view of the adjustable fastening device in portion, constructed in accordance with some embodiments.

Furthermore, the base plate 302, the gas injector cover 216 and the gas injector 116 (or the extension portion 222 of the gas injector in the present case) each have a plurality of thread holes equidistantly distributed in a way so the plurality of bolts 306 are able to pass through the corresponding thread holes and are tightened to hold those components together. For example, FIG. 3B illustrates a top view of the base plate 302 with three thread holes 316. The three thread holes 316 are equidistantly distributed on the base plate 302, such as on a circle 318. In the present examples, the top portion 302A and the bottom portion 302B have round shapes. The thread holes 316 are formed on the edge region of the top portion 302A outside of the bottom portion 302B.

Thread holes on the gas injector cover 216 and the extension portion 222 are similarly configured. The thread holes match the thread pattern of the blots. When the fasteners 304 are configured as described above, each of the first nuts 306 is tuned to control the height of the gas injector 116, or the distance between the gas injector cover 216 and the extension portion 222 of the gas injector 116 at corresponding location; and the second nut 308 is fastened to hold the gas injector cover 216 and the gas injector 116 together.

In the existing structure, the fasteners are designed without this adjustment mechanism, the uneven fastening forces among different fasteners and the distortion caused thereby cannot be effectively adjusted and eliminated, thus causing the uneven contacts and forces between the transparent window 214 and the O-ring 212. This further leads to leaking issue through the interface between the transparent window 214 and the O-ring 212. In the disclosed AFD 220, each fastener 304 independently and individually can be tuned with corresponding height and distance at the corresponding location to achieve the optimized sealing effect between the O-ring 212 and the transparent window 214, thereby the leakage being eliminated.

Figure 4:
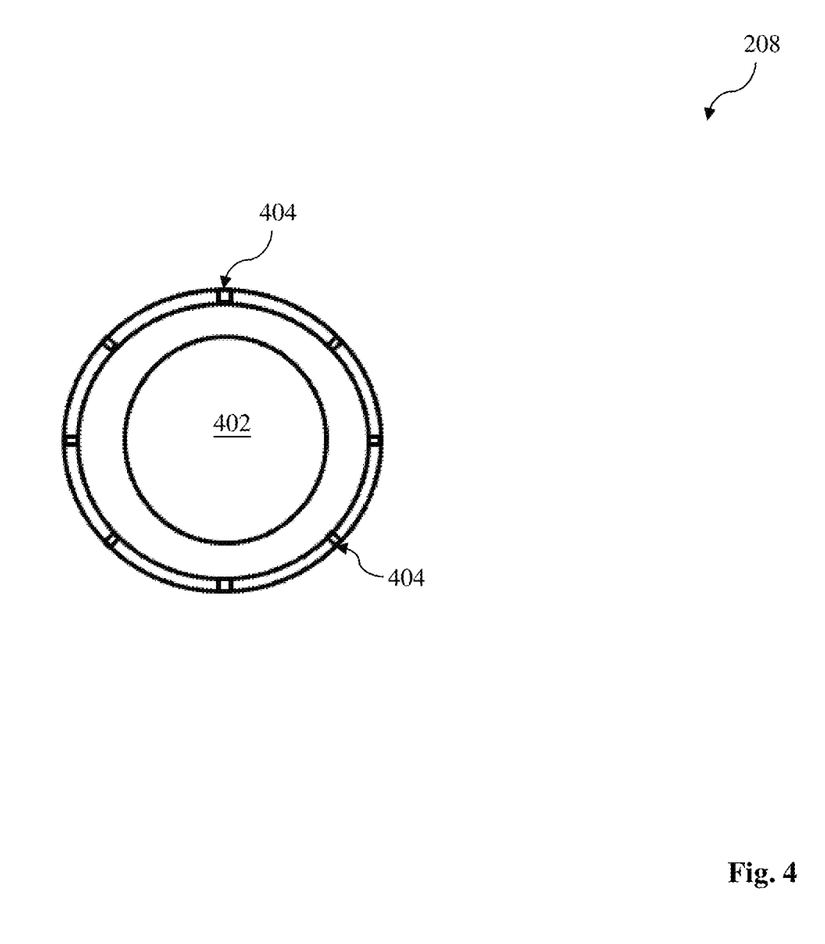
FIG. 4 illustrates a top view of an injector tip of the gas injector, constructed in accordance with some embodiments.

FIG. 4 illustrates a top view of the gas injector head 208 in accordance with some embodiments. The gas injector head 208 includes a plurality of openings for the chemical gas to be injected therethrough. In the present embodiment, the gas injector head 208 includes a central opening 402 and multiple edge openings 404 equidistantly distributed on the edge. For examples, the gas injector head 208 includes eight edge openings 404. The edge openings 404 have a smaller radius than that of the central opening 402.

Figure 5:
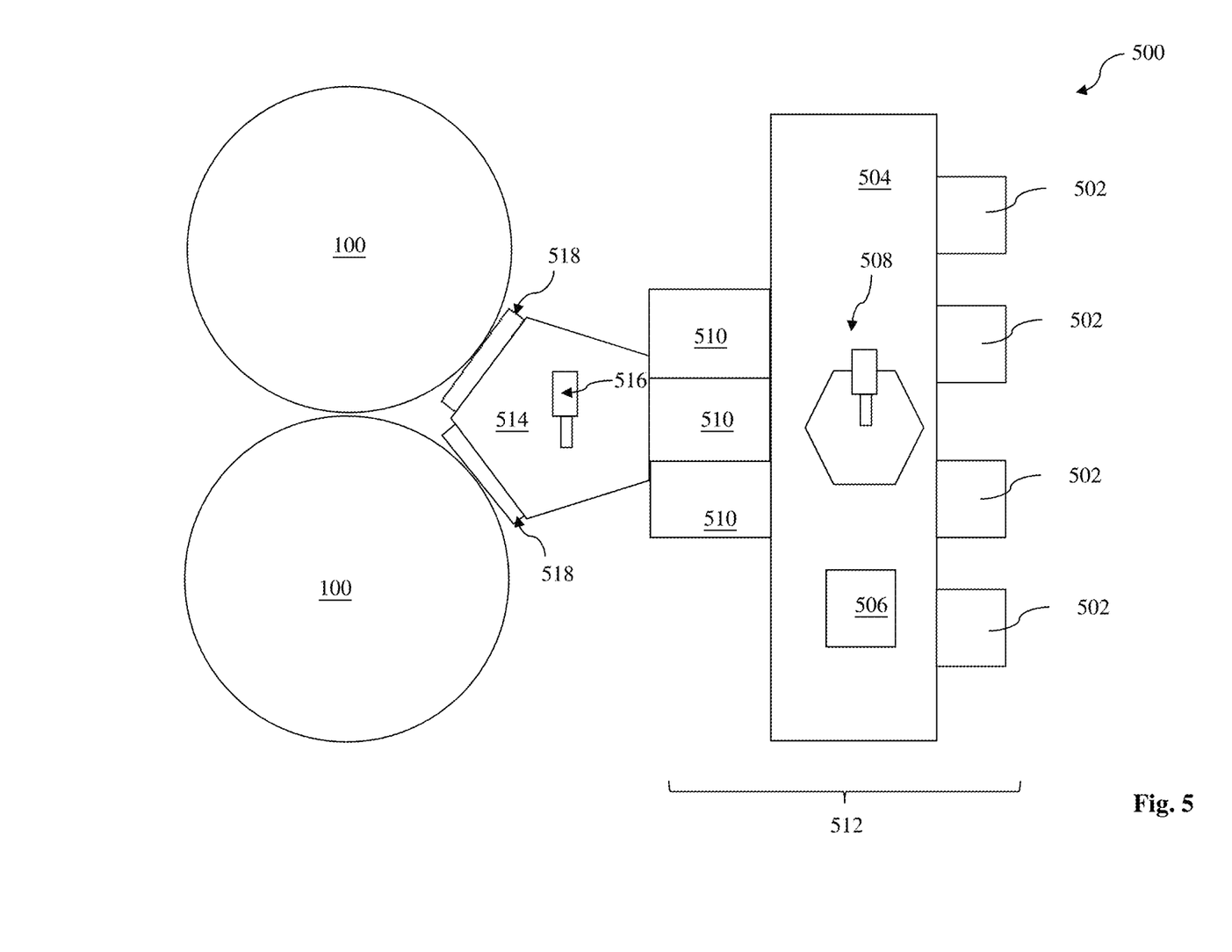
FIG. 5 illustrates a schematic view of an integrated circuit (IC) fabrication system having the plasma module, constructed in accordance with some embodiments.

FIG. 5 is a block diagram of an integrated circuit (IC) fabrication system 500 in accordance with some embodiments. The IC fabrication system 500 includes one or more plasma modules 100 integrated together in in a cluster tool. Especially, the plasma module 100 includes one or more chemical delivery unit 114 each having an AFD 220 to fasten the gas injector cover 216 and provide enhanced sealing effect to the interface between the transparent window 214 and the O-ring 212. In an illustrative embodiment, the IC fabrication system 500 includes two plasma module 100 properly configured and integrated.

The IC fabrication system 500 includes one or more load port 502, through which wafers are loaded and unloaded to the IC fabrication system 500. In the present embodiments, the wafers are loaded and unloaded in batches, by using wafer containers, such as front opening unified pods (FOUPs).

The IC fabrication system 500 may include a loader (or front end unit) 504 for holding, manipulating and transferring wafers. For examples, the loader 504 includes one or more substrate stage 506 for holding and/or orienting one or more wafer. In other examples, the loader 504 includes one or more robot 508 for handling wafers, such as transferring wafers to the plasma modules 100 or to load lock chambers (or load lock units) 510. The robot 508 is configured between the load port 502 and the load lock chambers in a way for proper wafer transferring therebetween. For example, each wafer is transferred by the robot 508 from the load port 502 or from the substrate stage 506 to one of load lock chambers, or is transferred back to the load port 502 by the robot 508. In some embodiments, the IC fabrication system 500 may further include other components, such as one or more load lock chambers 510 configured and designed for various functions, such as pre-orientation and preconditioning. The preconditioning may include degassing, pre-heating or other functions. For examples, multiple load lock chambers 510 may designed and configured for various preconditioning functions, respectively. In some examples, a wafer is oriented, degassed and/or pre-heated in one of the load lock chambers 510 to prepare the wafer for the plasma processing. The IC fabrication system 500 may be configured differently. For example, the load lock chamber 510 in the middle may be used as a path to transfer the wafer(s). In other examples, the IC fabrication system 500 may further include a vacuum module integrated to provide vacuum conditions to respective regions, such as the plasma modules 100. The load ports 502, the loader 504 and the load lock chambers 510 are collectively referred to as a load lock module 512.

The IC fabrication system 500 may further include a transfer module 514 for wafer transfer between the plasma modules 100 and the load lock chambers 510. In some embodiments, the transfer module 514 further includes one or more robot 516 for wafer transferring. The transfer module 514 has openings (doors) 518 connected to the plasma modules 100, respectively.

Figure 6:
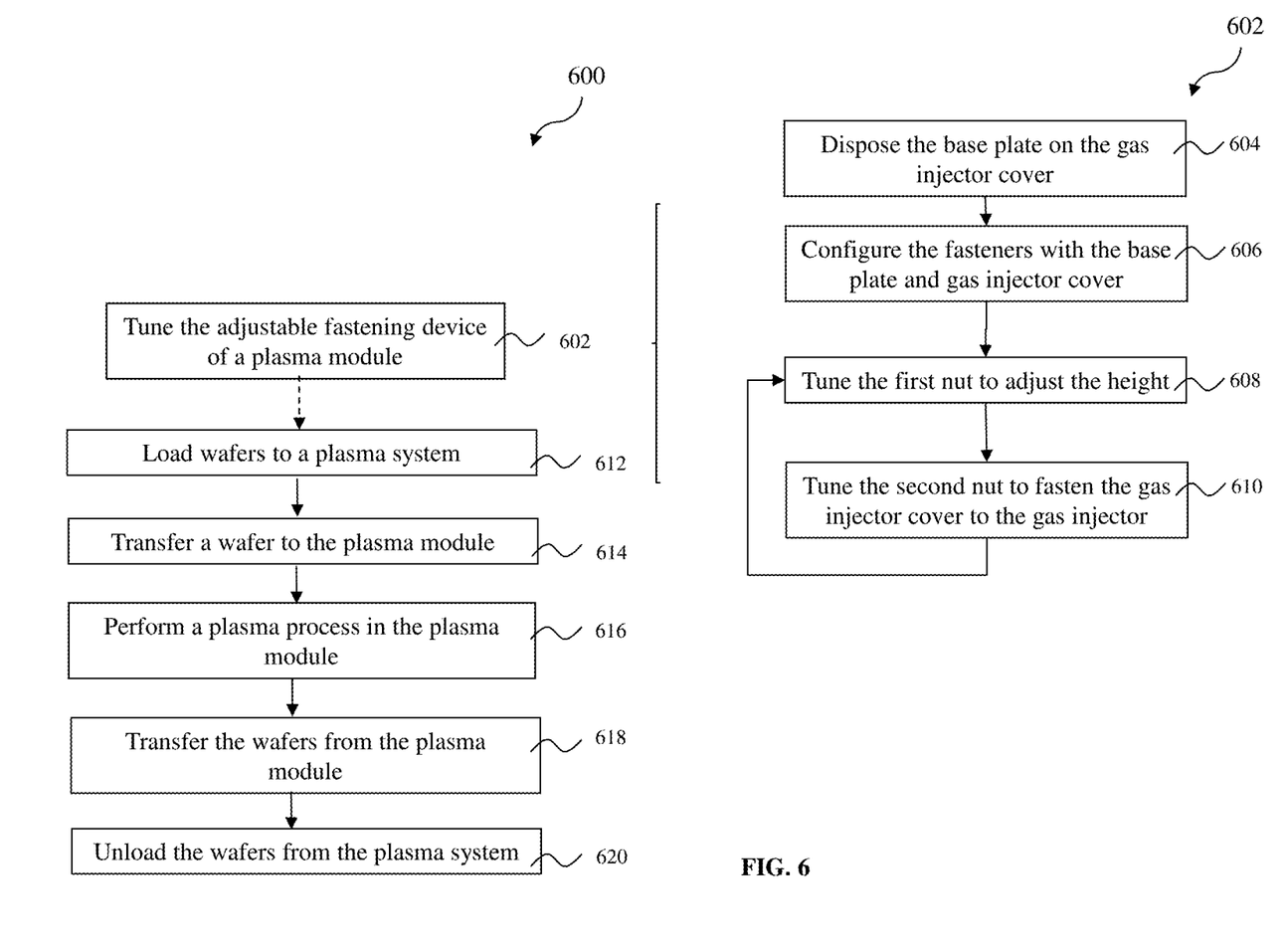
FIG. 6 is a flowchart of a method to utilize the plasma module, in accordance with some embodiments.

FIG. 6 is a flowchart of a method 600 fabricating one or more semiconductor wafers 108 ((particularly, plasma etching a material layer of the semiconductor wafer), in accordance with some embodiments. The method 600 is implemented in the IC fabrication system 500 of FIG. 5. The method 600 is described with reference to FIGS. 5, 6 and other figures.

The method 600 includes an operation 602 to fasten the gas injector 116 with the AFD 220. As noted above, the AFD 220 includes multiple sets of fasteners 304, each further including a bolt 306 and two nuts 310 and 312 sleeved on the corresponding bolt 306. The first nut 310 is configured above the base plate (particularly, between the bolt head 308 and the base plate 302); and the second nut 312 is configured between the base plate 302 and the gas injector cover 216. The operation 602 may include multiple steps. For examples, the operation 602 includes a step 604 to dispose the base plate 302 on the gas injector cover 216 in a proper configuration such that the thread holes of the both parts are aligned.

The operation 602 also includes a step 606 to configure the fasteners 304 with the base plate 302 and the gas injector cover 216. In the present embodiment, the AFD 220 includes three sets of fasteners 304. To each fastener 304, the first nut 310 and the second nut 312 are sleeved on the corresponding bolt 306. Particularly, the first nut 310 is configured above the base plate (particularly, between the bolt head 308 and the base plate 302); and the second nut 312 is configured between the base plate 302 and the gas injector cover 216.

The operation 602 includes a step 608 to adjust the height of the gas injector cover 216 (or control the distance between the base plate 302 and the gas injector cover 216) by tuning the first nut 310; and a step 610 to fasten the gas injector cover 216 to the gas injector 220 by tuning the second nut 312, which adjusts a fastening force between the gas injector cover and the gas injector and further the contact force between the O-ring 212 and the transparent window 214.

The steps 608 and 610 are repeated to other fasteners 304 and may repeat many cycles to all fasteners until the gas injector cover 216 is fastened to the gas injector 116 such that the O-ring 214 and the transparent window 214 are evenly contacted with improved sealing effect, thereby eliminating leaking through the interface between that the O-ring 214 and the transparent window 214.

After the completion of the operation 602 and other initial conditioning, the IC fabrication system 500 is ready for and may proceed to IC fabrication. For example, the method 600 may include an operation 614 to load one or more wafers to the IC fabrication system 500 through the load ports 502. For example, wafers are in one or more batches, such as in FOUPs, are loaded to the IC fabrication system 500 through the load ports 502 in one or more steps, such as loading, degassing, pre-heating, orienting or a subset thereof.

The method 600 includes operation 614 to transfer one or more wafer to one of the plasma module 100 by the robot 516 through the opening 518. For example, the robot 516 sequentially transfers one or more wafer to each of the plasma modules 100. In other examples, the transfer module 514 may include two or more robots 516 to simultaneously transfer wafers to respective plasma modules 100. Specifically, in the present embodiment, one wafer 108 is transferred to the substrate stage 106 of the corresponding plasma module 100 in a configuration that the front surface of the wafer faces upward.

The method 600 proceeds to an operation 616 to perform plasma process to the wafer(s) 108 in one of the plasma modules 100. The operation 616 and following operations are described with one plasma module and one wafer. However, as described above, the multiple wafers may be processed in one of multiple plasma modules 100 and the multiple plasma modules 100 may work in parallel. In the present embodiment, a plasma process is a plasma etching process being applied to the front surface of the wafer 108 during the operation 516. For example, one or more chemical delivered to the processing chamber 102 may be partially converted into plasma to provide etching effect to the semiconductor wafer 108. In some embodiments, the operation 616 may include injecting the chemical to the processing chamber 102 by the gas injector 116; generating plasma to the chemical; and directing the chemical to the semiconductor wafer 108 for etching.

In one example, the front surface of the wafer 108 includes a metal layer, and the plasma etching process is applied to selectively etch the metal. In furtherance of the example, the metal is copper, the etchant (etching gas) may include $CH_4$ and Ar; $CH_4$ and $N_2$; $H_2$ and Ar; or $H_2$ and $N_2$. Accordingly, each plasma module 100 may include more than chemical delivery unit 114 to deliver the corresponding gases.

In one example, the front surface of the wafer 108 includes a poly-silicon layer, and the plasma etching process is applied to selectively etch the poly-silicon. In furtherance of the example, the etchant include HBr, $Cl_2$, $SF_6$, $O_2$, Ar, He, or a combination thereof. Accordingly, each plasma module 100 may include more than chemical delivery unit 114 to deliver the corresponding gases.

In yet another example, the front surface of the wafer 108 includes a silicon oxide layer, and the plasma etching process is applied to selectively etch the silicon oxide. The etchant may include $CF_4$, $C_3F_8$, $C_4F_8$, $CHF_3$, $CH_2F_2$ or a combination thereof. The plasma process may be, alternatively, plasma-enhanced deposition or plasma treatment.

After the completion of the deposition process to the wafer 108 in the plasma modules 100 by the operation 616, the method 600 proceeds to an operation 618 to transfer the wafer 108 to the load lock chamber(s) 510 by the robot 516. This operation is similar to the operation 614 but it is reversed. For example, the multiple wafers are transferred to the load lock chambers 510 from the plasma modules 100, sequentially or in parallel by multiple robots 516.

The method 600 may further include an operation 620 to unload the wafers from the IC fabrication system 500 through the load port 502. The method 600 may include other operations, before, during or after the operations described above. For example, after the operation 620, the wafers may be transferred to other fabrication tools for following fabrications, such as lithography patterning process.

The IC fabrication system 500 and the method 600 may have other embodiments, or alternatives. For examples, even though the method 600 describes a procedure to perform a plasma etch to a wafer, the IC fabrication system and the method utilizing the same may be used to form various thin films, such as etching a gate dielectric layer, a gate electrode layer, a capping layer, a barrier layer, an etch stop layer, a dielectric layer for interlayer dielectric, or a conductive layer for metal lines.

The present disclosure provides an IC fabrication system and a method utilizing the same. By utilizing the disclosed IC fabrication system, the plasma process, such as plasma etching quality and efficiency are improved. The IC fabrication system includes one or more plasma module 100, each further including one or more chemical delivery unit 114 with an AFD 220. The AFD 220 includes multiple sets of fasteners 304, each further including a bolt 306 and two nuts 310 and 312 sleeved on the corresponding bolt 306. The first nut 310 is configured above the base plate (particularly, between the bolt head 308 and the base plate 302); and the second nut 312 is configured between the base plate 302 and the gas injector cover 216. The first nut 310 is tuned to control the distance and the second nut 312 is tuned to provide fastening force to secure the gas injector cover 216 to the gas injector 116 in a way such that the O-ring 214 and the transparent window 214 are evenly contacted with improved sealing effect, thereby eliminating leaking through the interface between that the O-ring 214 and the transparent window 214.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed IC fabrication system and the method, the IC fabrication, such as plasma etching, is improved with enhanced sealing and fabrication efficiency. Other advantages may include less manufacturing cost and higher manufacturing throughput.

Thus, the present disclosure provides a semiconductor fabrication apparatus. The semiconductor fabrication apparatus includes a processing chamber; a substrate stage provided in the processing chamber and being configured to secure and rotate a semiconductor wafer; a gas injector configured to inject a chemical to the processing chamber; a window attached to the gas injector; and an adjustable fastening device coupled with the gas injector and the window.

The present disclosure provides a semiconductor fabrication apparatus. The semiconductor fabrication apparatus includes a processing chamber; a substrate stage configured in the processing chamber and being operable to secure and rotate a semiconductor wafer; a gas injector attached to the processing chamber and designed to inject a chemical to the processing chamber; an O-ring configured to the gas injector; a window attached to the gas injector and in direct contacting with the O-ring; a gas injector cover disposed on the window; and an adjustable fastening device integrated with the gas injector and designed to secure the window and the gas injector cover to the gas injector with an adjustable height.

The present disclosure provides a method for semiconductor fabrication. The method includes providing a semiconductor fabrication apparatus. The semiconductor fabrication apparatus further includes a processing chamber; a substrate stage configured in the processing chamber and being operable to secure and rotate a semiconductor wafer; a gas injector attached to the processing chamber and designed to inject a chemical to the processing chamber; an O-ring configured to the gas injector; a window attached to the gas injector and in direct contacting with the O-ring; a gas injector cover disposed on the window; and an adjustable fastening device integrated with the gas injector and designed to secure the window and the gas injector cover to the gas injector with an adjustable height. The adjustable fastening device includes a base plate configured on the gas injector cover; and a plurality of fasteners to fasten the gas injector cover to the gas injector, wherein each of the fasteners includes a bolt, a first nut and a second nut both sleeved on the bolt, wherein the first nut is configured above the base plate and the second nut is configured between the base plate and the gas injector cover. The method further includes performing an etching process to the semiconductor wafer by the semiconductor apparatus.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication apparatus, comprising:
a processing chamber;
a substrate stage provided in the processing chamber and being configured to secure and rotate a semiconductor wafer;
a gas injector configured to inject a chemical to the processing chamber, wherein the gas injector comprises a cylindrical body having a passage, the cylindrical body includes a lower portion secured to the processing chamber and an upper portion on the lower portion, wherein the gas injector further comprises an extension portion adjacent to the upper portion of the gas injector and one or more inlets disposed on a sidewall of the upper portion of the cylindrical body, wherein the one or more inlets are configured to receive the chemical from a gas supply source and deliver the chemical to the passage;
a transparent window disposed over the cylindrical body of the gas injector;
an O-ring interposed between the gas injector and the transparent window, wherein the 0-ring directly contacts the gas injector and the transparent window;
a gas injector cover disposed on both the gas injector and the transparent window, wherein a bottom surface of the gas injector cover is in direct contact with top surfaces of the transparent window and the extension portion of the gas injector, the top surface of the extension portion of the gas injector is above a top surface of the cylindrical body of the gas injector, and the gas injector cover is spaced apart from the cylindrical body of the gas injector by the transparent window; and
an adjustable fastening device disposed over the gas injector cover and configured to hold the transparent window, the O-ring and the gas injector cover together to provide a sealing effect, wherein the adjustable fastening device comprises a base plate disposed over the gas injector cover.

2. The semiconductor fabrication apparatus of claim 1, wherein the O-ring is disposed on a circular groove of the gas injector and is capped by the transparent window.

3. The semiconductor fabrication apparatus of claim 2, wherein the transparent window is made of liquid silicon rubber.

4. The semiconductor fabrication apparatus of claim 2, wherein the adjustable fastening device further includes a plurality of fasteners configured to fasten the gas injector cover to the gas injector.

5. The semiconductor fabrication apparatus of claim 4, wherein the gas injector cover has an inclined top plane and the base plate is configured to directly contact the inclined top plane of the gas injector cover.

6. The semiconductor fabrication apparatus of claim 5, wherein each of the fasteners includes a bolt having a bolt head, a first nut and a second nut both sleeved on the bolt and disposed under the bolt head,
wherein the base plate includes a top portion having a first dimension D1 and a bottom portion having a second dimension D2 less than D1,
wherein the first nut is in direct contact with a top surface of the top portion of the base plate and disposed between the bolt head and the base plate, and the second nut is configured below a bottom surface of the top portion of the base plate and is interposed between the base plate and the gas injector cover, wherein the second nut is in direct contact with the gas injector cover, and
the bolt extends through the top portion of the base plate.

7. The semiconductor fabrication apparatus of claim 6, wherein the first nut is operable to adjust a distance between the gas injector cover and the base plate; and the second nut is operable to adjust a fastening force between the gas injector cover and the gas injector.

8. The semiconductor fabrication apparatus of claim 6, wherein
the gas injector cover includes a plurality of cover thread holes equidistantly distributed in a circle around a center of the gas injector cover;
the base plate includes a plurality of base thread holes equidistantly distributed in a circle around a center of the base plate; and
the plurality of fasteners are configured with respective bolts each passing through one of the base thread holes and one of the cover thread holes.

9. The semiconductor fabrication apparatus of claim 8, wherein the plurality of cover thread holes includes three cover thread holes; the plurality of base thread holes includes three base thread holes; and the plurality of fasteners includes three fasteners.

10. The semiconductor fabrication apparatus of claim 1, wherein the gas injector cover is made of polytetrafluoroethylene (PTFE).

11. The semiconductor fabrication apparatus of claim 1, further comprising:
a pump module integrated to the processing chamber and configured to control a pressure thereof; and
a plasma generating module integrated with the processing chamber and configured to generate plasma therein, wherein the chemical is injected into the processing chamber by the gas injector and is further converted into plasma to provide etching effect to the semiconductor wafer.

12. A semiconductor fabrication apparatus, comprising:
a processing chamber;
a substrate stage configured in the processing chamber and being operable to secure and rotate a semiconductor wafer;
a gas injector comprising an inlet, a cylindrical body having a passage, and an extension portion adjacent to an upper portion of the cylindrical body, wherein the upper portion of the cylindrical body is mechanically coupled to the inlet which is configured to receive a chemical from a chemical supply source, and a lower portion of the cylindrical body is mechanically coupled to the processing chamber and configured to inject the chemical to the processing chamber through the passage, wherein the extension portion of the gas injector comprises a plurality of first thread holes;

an O-ring provided in a circular groove of the gas injector;
a transparent window disposed on the cylindrical body of the gas injector and in direct contact with the O-ring;
a gas injector cover disposed on the transparent window and the gas injector and comprising a plurality of second thread holes, wherein a bottom surface of the gas injector cover is in direct contact with both the transparent window and the extension portion of the gas injector, and wherein the gas injector cover is spaced apart from the cylindrical body of the gas injector; and
an adjustable fastening device mechanically coupled to the extension portion of the gas injector, wherein the adjustable fastening device comprises a base plate and a plurality of fasteners, wherein the base plate is disposed over the gas injector cover and includes a plurality of third thread holes, the plurality of fasteners are engaged with the plurality of first, second, and third thread holes to secure the transparent window and the gas injector cover to the extension portion of the gas injector.

13. The semiconductor fabrication apparatus of claim 12, wherein each of the plurality of fasteners includes a threaded bolt having a bolt head, a first nut and a second nut both sleeved on the threaded bolt and disposed under the bolt head.

14. The semiconductor fabrication apparatus of claim 13, wherein
the base plate includes a top portion having a first dimension D1 and a bottom portion having a second dimension D2 less than D1;
the first nut is disposed between the base plate and the bolt head and in direct contact with the base plate; and
the second nut is configured below the top portion of the base plate and above the gas injector cover and in direct contact with the gas injector cover.

15. The semiconductor fabrication apparatus of claim 14, wherein the first nut is operable to adjust a distance between the gas injector cover and the base plate; and the second nut is operable to adjust a fastening force between the gas injector cover and the gas injector.

16. The semiconductor fabrication apparatus of claim 15, wherein
the plurality of second thread holes include three thread holes and are equidistantly distributed in a circle around a center of the gas injector cover;
the plurality of third thread holes include three thread holes and are equidistantly distributed in a circle around a center of the base plate; and
the plurality of fasteners are configured such that each bolt passing through one of the plurality of third thread holes and one of the plurality of second thread holes.

17. The semiconductor fabrication apparatus of claim 12, further comprising:
a pump module integrated to the processing chamber and configured to control a pressure thereof; and
a plasma generating module integrated with the processing chamber and configured to generate plasma therein, wherein the chemical is injected into the processing chamber by the gas injector and is further converted into plasma to provide etching effect to the semiconductor wafer.

18. A semiconductor fabrication apparatus, comprising:
a processing chamber;
a substrate stage configured in the processing chamber and being operable to secure and rotate a semiconductor wafer;
a gas injector comprising a cylindrical body having an upper portion and a lower portion and designed to inject a chemical to the processing chamber, wherein the upper portion is configured to receive a chemical via an inlet disposed thereon, and the lower portion is mechanically coupled to the processing chamber, wherein the gas injector further comprises an extension portion adjacent to the upper portion;
a transparent window disposed on the upper portion of the cylindrical body of the gas injector;
an O-ring disposed on a circular groove of the upper portion of the cylindrical body of the gas injector and capped by the transparent window, wherein the O-ring directly contacts the gas injector and the transparent window;
a gas injector cover disposed above both the gas injector and the transparent window, and wherein the gas injector cover is in direct contact with top surfaces of the extension portion of the gas injector and the transparent window and is spaced apart from the cylindrical body of the gas injector; and
an adjustable fastening device mechanically coupled to the gas injector and designed to secure the transparent window and the gas injector cover to the gas injector, wherein the adjustable fastening device comprises:
a base plate disposed over the gas injector cover, wherein the base plate is an integral structure and comprises a top portion having a first dimension D1 and a bottom portion having a second dimension D2, D2 is less than D1, wherein the top portion is spaced apart from the gas injector cover by the bottom portion; and
a plurality of fasteners configured to fasten the gas injector cover to the gas injector, wherein each of the plurality of fasteners comprises a corresponding bolt having a bolt head, a first corresponding nut and a second corresponding nut both sleeved on the corresponding bolt and disposed under the bolt head, wherein the first corresponding nut is positioned between the top portion of the base plate and the gas injector cover and in direct contact with the gas injector cover to operably adjust a fastening force between the gas injector cover and the gas injector, and wherein the second corresponding nut is positioned between the bolt head and the top portion of the base plate and in direct contact with the top portion of the base plate to adjust a distance between the base plate and the gas injector cover.

19. The semiconductor fabrication apparatus of claim 18, wherein the gas injector cover has an inclined top surface in direct contact with a bottom surface of the base plate.

20. The semiconductor fabrication apparatus of claim 18, wherein the second dimension D2 is less than D1 such that the corresponding bolt passes through a first corresponding thread hole in the top portion and a second corresponding thread hole in the gas injector cover without passing through the bottom portion.

* * * * *